(12) United States Patent
Shirakawa et al.

(10) Patent No.: US 7,463,515 B2
(45) Date of Patent: Dec. 9, 2008

(54) SEMICONDUCTOR MEMORY DEVICE

(75) Inventors: Masanobu Shirakawa, Fujisawa (JP);
Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/773,280

(22) Filed: Jul. 3, 2007

(65) Prior Publication Data
US 2008/0123410 A1   May 29, 2008

(30) Foreign Application Priority Data
Jul. 5, 2006   (JP) .............................. 2006-185677

(51) Int. Cl.
*G11C 16/26* (2006.01)
(52) U.S. Cl. .............................. 365/185.03; 365/185.09; 365/185.23; 365/200
(58) Field of Classification Search ............. 365/185.09
See application file for complete search history.

(56) References Cited

U.S. PATENT DOCUMENTS

| | | | |
|---|---|---|---|
| 6,404,683 B1 * | 6/2002 | Yumoto | 365/200 |
| 6,426,892 B2 | 7/2002 | Shibata et al. | |
| 7,313,022 B2 * | 12/2007 | Takeuchi et al. | 365/185.09 |
| 2008/0123409 A1 * | 5/2008 | Shirakawa | 365/185.03 |

FOREIGN PATENT DOCUMENTS

JP   2003-109396   4/2003

OTHER PUBLICATIONS

U.S. Appl. No. 11/773,280, filed Jul. 3, 2007, Shirakawa et al.
U.S. Appl. No. 12/040,155, filed Feb. 29, 2008, Tokiwa.

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A semiconductor memory device includes: a memory cell array with electrically rewritable and non-volatile memory cells arranged therein; a row decoder configured to select a memory cell in the memory cell array, the row decoder including a flag latch, in which a bad block flag is set for a bad block in the memory cell array; a sense amplifier configured to sense data of a selected memory cell in the memory cell array; and an output circuit configured to output read data in the sense amplifier, the output circuit including an output data fixing circuit configured to fix an output data at a logic level in accordance with the bad block flag.

11 Claims, 14 Drawing Sheets

|  | Signal OA |
|---|---|
| 1st Page Read (Read Voltage BR) | L |
| 1st Page Read (Read Voltage CR) | H |
| 2nd Page Read (Read Voltage AR) | L |

SEMICONDUCTOR MEMORY DEVICE

CROSS-REFERENCE TO RELATED APPLICATION

This application is based on and claims the benefit of priority from the prior Japanese Patent Application No. 2006-185677, filed on Jul. 5, 2006, the entire contents of which are incorporated herein by reference.

BACKGROUND OF THE INVENTION

1. Field of the Invention

This invention relates to a semiconductor memory device, more specifically to a defective block management scheme of an EEPROM flash memory, in which electrically rewritable and non-volatile memory cells are used.

2. Description of the Related Art

A NAND-type flash memory has features as follows: the unit cell area is smaller than that of a NOR-type one; and it is easy to increase the capacitance. Recently, by use of a multi-level data storage scheme, in which one cell stores two or more bits, it has been developed a NAND-type flash memory with a further increased capacitance.

In the NAND-type flash memory with a binary data storage scheme, for example, an erase state with a negative threshold voltage is defined as data "1"; and a write state with a positive threshold voltage as data "0".

The above-described principle of data bit assignment can be adapted to a four-level data storage scheme with respect to both of upper page and lower page. For example, four-level data "xy" (where "x" is an upper page; and "y" a lower page) can be defined as "11", "10", "01" and "00" in the order of cell threshold. In this scheme, both of the lower page read and the upper page read may be performed under the condition that a selected cell's on-state is defined as data "1" while an off-state is defined as data "0".

By contrast, there is another four-level data storage scheme, in which "11", "10", "00" and "01" are assigned in the order of cell threshold voltage (for example, refer to JP-P2001-93288A). In this case, the lower page read in case of the upper page data "1" should be performed under the condition that a selected cell's off-state is read as "0" while the lower page read in case of the upper page data "0" should be performed under the condition that a selected cell's off-state is read as "1".

A sense amplifier circuit always senses the off-state and on-state of a cell as data reversed in logic. Therefore, to distinguish between "0" read of the cell's off-state and "1" read of cell's on-state, it is required of an output circuit to be attached such a data inverting circuit that the lower page sense amplifier data is output outside the chip as it is when the upper page data is "1" while the lower page sense amplifier data is output together with level inverting when the upper page data is "0".

On the other hand, there is known such a defective (or bad) block management method as follows. There is prepared a flag latch in a row decoder for selecting a block, in which a bad block flag is to be set, and it is controlled that no drive voltage is transferred to a block, in which the bad block flag is set. In this case, to make the external controller possible to judge whether the respective blocks are good or bad, it is prepared a bad block management area in one page, which is defined as a cell range where read/write is performed simultaneously. For example, the cell in the bad block management area is set to be normally-on with a read voltage applied (i.e., set to be in an erase state).

Setting the above-described bad block management area in the binary data storage scheme, the external memory controller may distinguish between a case of one page read data being all "0" in a normal block and another case of one page data being all "0" in a bad block because the bad block management area is "1" in the former case while it is "0" in the latter case.

However, in the four-level data storage scheme, in which read data may be inverted in the output circuit as described above, it often happens such a case that it is impossible to judge goodness/badness of a block if only monitoring the management area data. The reason is as follows: in case of the lower page read, in which data inverting is required, if all data "0" are inverted in the output circuit with respect to a bad block, the management area data becomes "1" (normal).

SUMMARY OF THE INVENTION

According to an aspect of the present invention, there is provided a semiconductor device including:

a memory cell array with electrically rewritable and non-volatile memory cells arranged therein;

a row decoder configured to select a memory cell in the memory cell array, the row decoder including a flag latch, in which a bad block flag is set for a bad block in the memory cell array;

a sense amplifier configured to sense data of a selected memory cell in the memory cell array; and an output circuit configured to output read data in the sense amplifier, the output circuit including an output data fixing circuit configured to fix an output data at a logic level in accordance with the bad block flag.

According to another aspect of the present invention, there is provided a semiconductor memory device including:

a memory cell array with electrically rewritable and non-volatile memory cells arranged therein, a certain location in one page of the memory cell array being set as a management area, based on which an external controller judges whether a block is good or bad;

a row decoder configured to select a memory cell in the memory cell array, the row decoder including a flag latch, in which a bad block flag is set for a bad block in the memory cell array;

a sense amplifier circuit configured to sense data of one page memory cells selected in the memory cell array;

an output circuit configured to output read data in the sense amplifier, the output circuit including a data inverting circuit for inverting and outputting the read data in the sense amplifier circuit under a certain read condition and an output data fixing circuit configured to fix an output data at a logic level in accordance with the bad block flag; and an internal controller configured to detect the bad block flag held in the row decoder and make the output data fixing circuit active or inactive based on the bad block flag, whereby the management area data in a normal block is reversed in logic to that in a bad block in the output circuit.

DETAILED DESCRIPTION OF THE EMBODIMENTS

Illustrative embodiments of this invention will be explained with reference to the accompanying drawings below.

Figure 1:
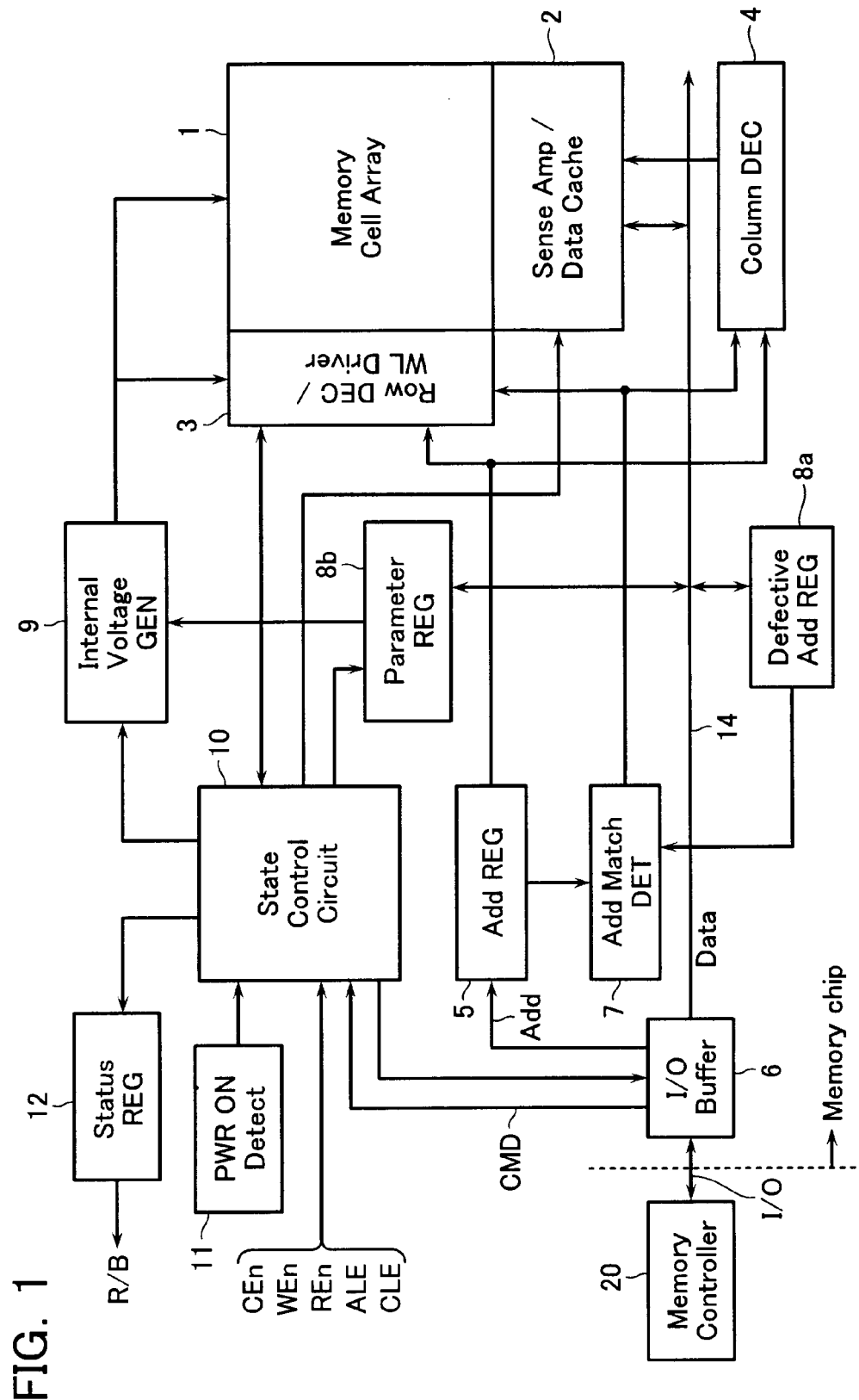
FIG. 1 shows a functional block configuration of a flash memory in accordance with an embodiment of the present invention.
Figure 2:
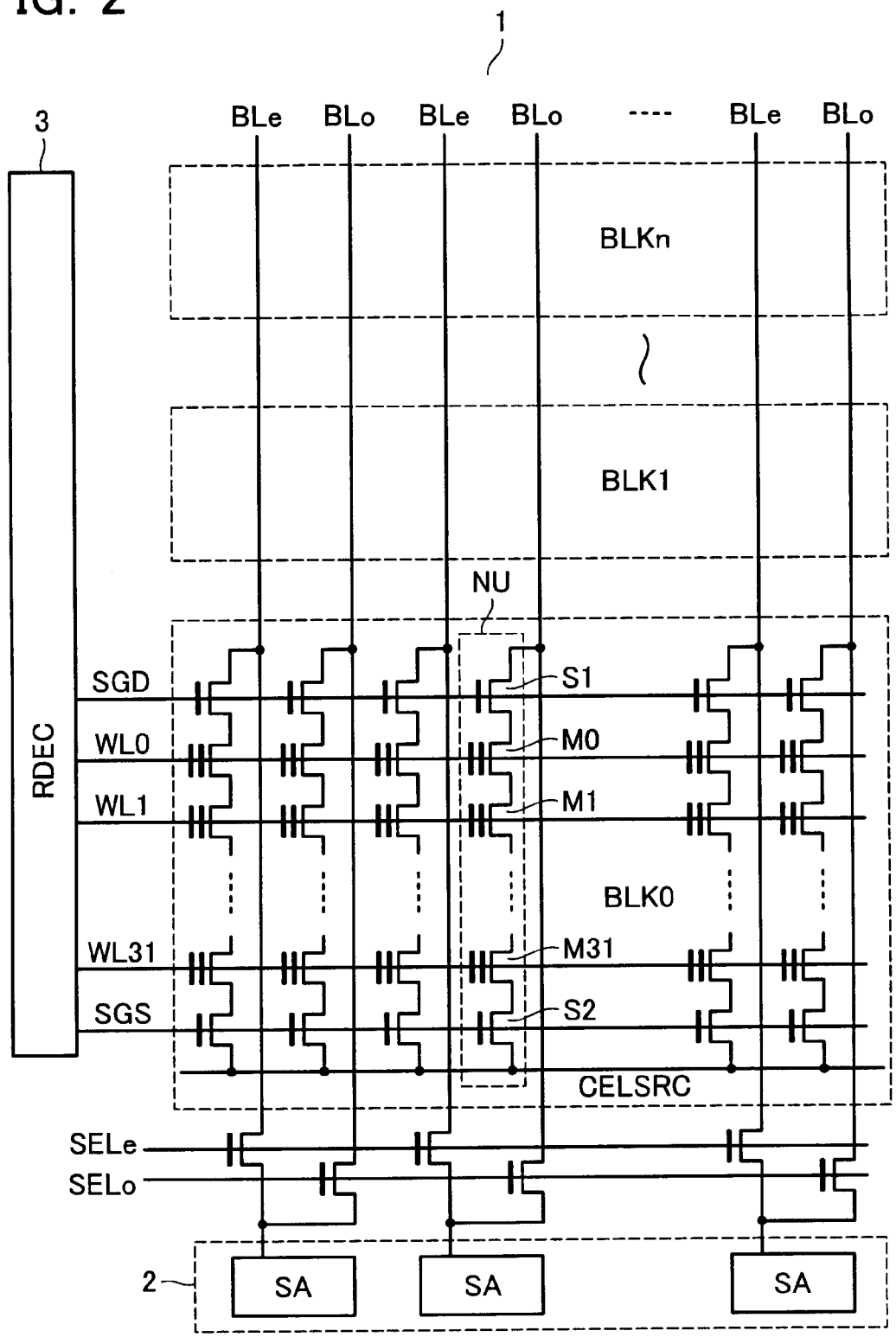
FIG. 2 shows a memory cell array configuration of the flash memory.

FIG. 1 shows a functional block of a flash memory in accordance with this embodiment; and FIG. 2 the memory cell array 1.

Memory cell array 1 is, as shown in FIG. 2, formed of NAND cell units NU arranged in a matrix manner. Each NAND cell unit NU has a plurality of (thirty two in the example shown in FIG. 2) electrically rewritable and non-volatile memory cells M0-M31 connected in series, and select gate transistors S1 and S2 for coupling both ends thereof to a bit line BLe (or BLo) and a source line CELSRC, respectively.

Control gates of memory cells in the NAND cell unit NU are coupled to different word lines WL0-WL31. Gates of select gate transistors S1 and S2 are coupled to select gate lines SGD and SGS, respectively.

A set of NAND cell units sharing word lines WL0-WL31 constitutes a block serving as an erase unit. As shown in FIG. 2, multiple blocks BLK (BLK0, BLK1, . . . ) are arranged in the direction of the bit line.

Row decoder 3 includes word line drivers and select gate line drivers for selectively driving word lines and select gate lines in accordance with row address. Sense amplifier circuit 2 has an array of sense amplifiers SA coupled to bit lines for reading data by a page, which serve as data latches for storing one page write data. With this sense amplifier circuit 2, data read and write are performed by a page. Sense amplifier circuit 2 includes data caches for transmitting/receiving data between data bus and itself.

In the example shown in FIG. 2, it is used such a sense amplifier scheme that adjacent two bit lines BLe and BLo share one sense amplifier SA. Adjacent two bit lines BLe and BLo are selectively coupled a sense amplifier SA via a bit line select gate.

Data transfer between the sense amplifier circuit 2 and external input/output terminals I/O is performed via I/O buffer 6 and data bus 14. Attached to the sense amplifier circuit 2 is a column gate circuit controlled by column decoder 4. Assuming, for example, that there are eight I/O terminals I/O (I/O0-I/O7), serial data transfer is performed between the sense amplifier 2 and I/O terminals by a Byte (i.e., by a column) in accordance with column controlling.

Address "Add" supplied from the I/O terminals is transferred to row decoder 3 and column decoder 4 via address register 5. Command "CMD" supplied from the I/O terminals is decoded in state control machine (refer to as an internal controller hereinafter) 10.

The internal controller 10 executes data write and erase sequences and controls read operation based on various control signals (write enable signal WEn, read enable signal REn, command latch enable signal CLE, address latch enable signal ALE and the like), which are externally supplied from external memory controller (refer to as an external controller hereinafter) 20, and command "CMD".

Explaining in detail, this memory chip and external controller 20 are integrally installed to constitute a memory card. A host device using this memory chip supplies a required command(s) via the external controller 20 to set a suitable operation mode, thereby performing data read and write.

Internal voltage generation circuit 9 is controlled by internal controller 10 to generate various internal voltages required in the memory operation modes, in which boost circuits are prepared for generating voltages higher than the power supply voltage. Status register 12 is for outputting a status flag R/B outside the chip, which designates whether the chip is in a ready state of data write, erase or read or in a busy state.

Data registers 8a and 8b are for storing various initial set-up data, by which memory operation conditions are defined. Explaining in detail, register 8a is a defective column address register for storing defective column address data in the initial set-up data while register 8b is a parameter register for storing various parameter data such as timing trimming data and voltage trimming data, which are used for trimming various timing signals and various internal voltages generated from the internal voltage generator 9.

Data to be stored in these registers 8a and 8b are previously written in an initial set-up data storing block (ROM fuse block) set in the memory cell array 1. At a power-on time, power-on detecting circuit 11 detects it, and internal controller 10 automatically executes such an initial set-up operation in response to the power-on detect signal that the initial set-up data are read out the ROM fuse block, and transferred to and set in the registers 8a and 8b.

Address match detecting circuit 7 is for detecting whether an externally supplied column address is identical with one of the defective column addresses or not to output an address replacing control signal. As a result, it is performed such a control that a redundant column is selected in pace of a defective column.

Figure 3:
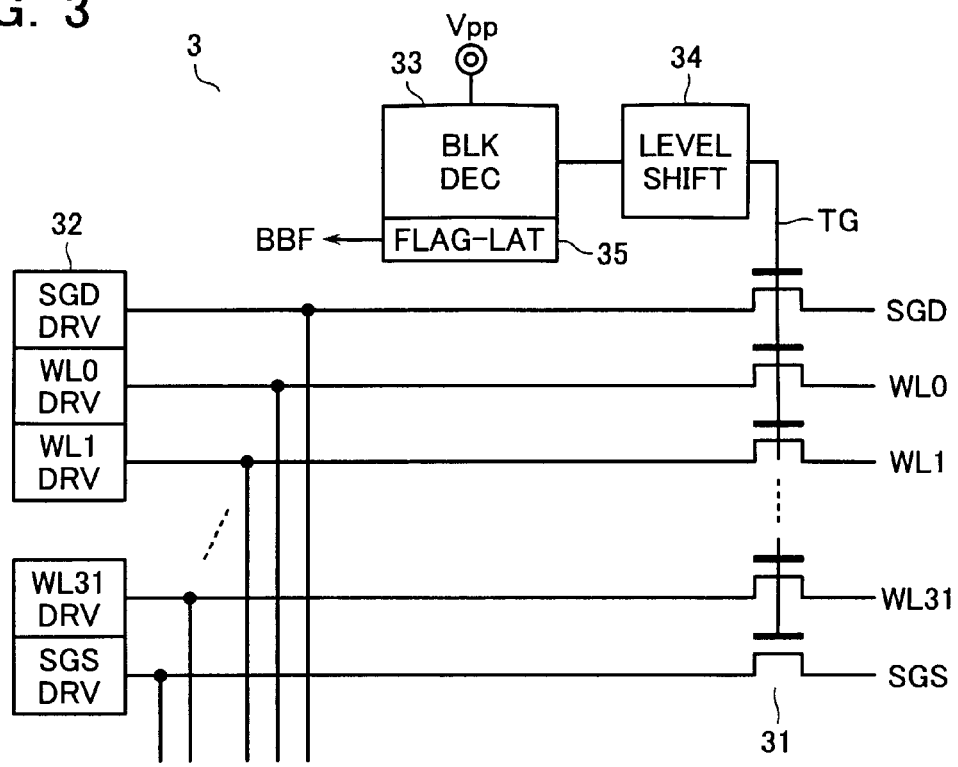
FIG. 3 shows a row decoder configuration of the flash memory.

FIG. 3 shows the detailed configuration of the row decoder 3, which has a transfer transistor array 31 for supplying drive voltages to word lines WL0-WL31 and select gate lines SGD and SGS, and a block decoder 33 for selecting a block to drive the common gate TG of the transistor array 31.

The output of block decoder 33 is input to a level shift circuit 34, in which high voltage Vpp generated from the voltage generation circuit 9 is set at a suitable level and transferred to the common gate TG of the transfer transistor array 31.

A group of drivers 32 is shared by all blocks, which includes word line drivers WL0DRV-WL31DRV and select gate line drivers SGDDRV and SGSDRV for generating driving voltages necessary for driving word lines WL0-WL31 and select gate lines SGD and SGS. The driving voltages are supplied into a selected block via the transfer transistor array 31, which is on-driven.

Attached to the block decoder 33 is a flag data latch 35 for storing a defective (or bad) block flag. In case the bad block flag is set in this latch 35, even if the corresponding block is accessed, the block decoder 33 is kept in an inactive state, so that word lines and select gate lines in the corresponding block are not driven.

Figure 4:
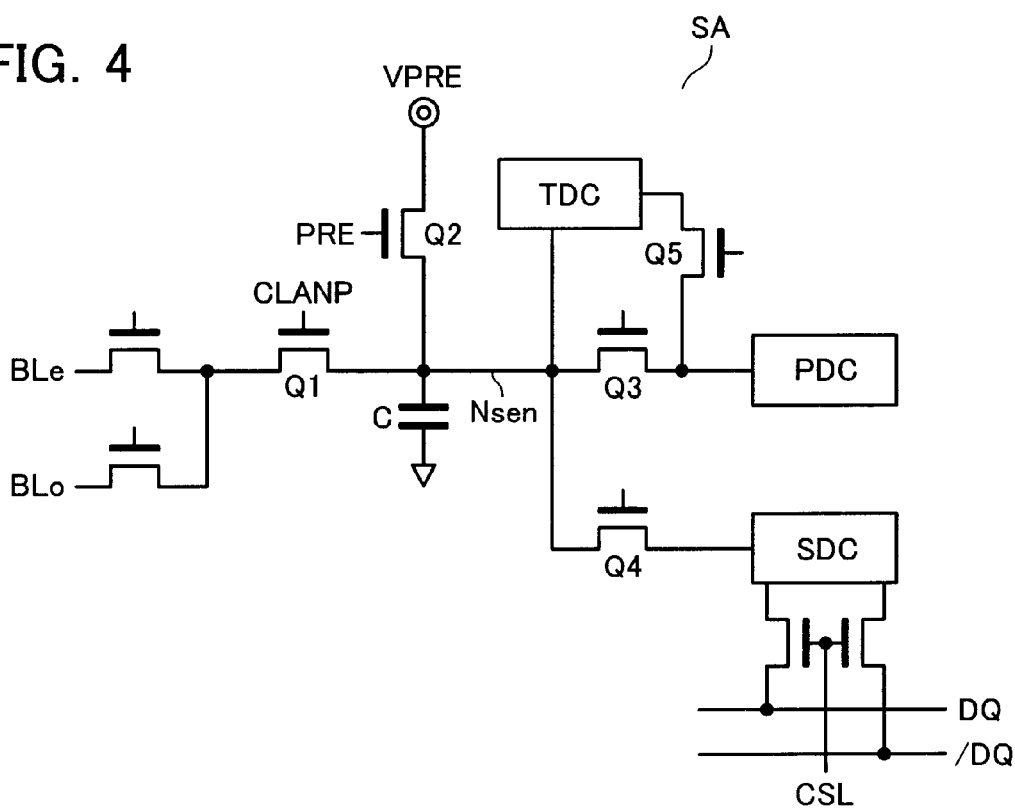
FIG. 4 shows a sense amplifier configuration of the flash memory.

FIG. 4 shows a configuration of a sense amplifier SA in the sense amplifier circuit 2. Sense node Nsen is coupled to a bit line BLe or BLo via clamping NMOS transistor Q1. Connected to the sense node Nsen are precharge NMOS transistor Q2, which precharges a bit line via clamping transistor Q1, and capacitor C for holding data charge.

Sense node Nsen is further coupled to a first data storage circuit PDC via transfer NMOS transistor Q3. The first data storage circuit PDC is, for example, a data latch for storing read data and write data.

Sense node Nsen is still further coupled to a second data storage circuit SDC via transfer NMOS transistor Q4. The second data storage circuit SDC serves as a caching data latch, which is used for data transferring between the sense amplifier and the external. Therefore, it is coupled to data lines DQ, /DQ via column gates driven by a column select signal.

To rewrite the write data stored in the data storage circuit PDC in accordance with the verity-read result obtained at every write cycle, another data storage circuit TDC is prepared. That is, write data stored in data storage circuit PDC is transferred to and temporally stored in data storage circuit TDC via transfer transistor Q5 at each write cycle. With this data storage circuit TDC, such a control is performed that the following write data is determined by logic between data in data storage circuit TDC and verify-read result, and is written back to data storage circuit PDC.

In a multi-level data storage scheme, for example in a four-level data storage scheme, it is in need of performing two page write operations. Explaining in detail, it is required to refer to the upper page data when writing the lower page data, or it is required to refer to the lower page data when writing the upper page data. Suppose here that the upper page data is written with reference to the lower page data.

In this case, the upper page data to be written is, for example, stored in the first data storage circuit PDC while the lower page data is read out the memory cell array, if it has been written in the memory cell array, and stored in the second data storage circuit SDC. The verify-write of the upper page data will be controlled with reference to the lower page data.

Figure 5:
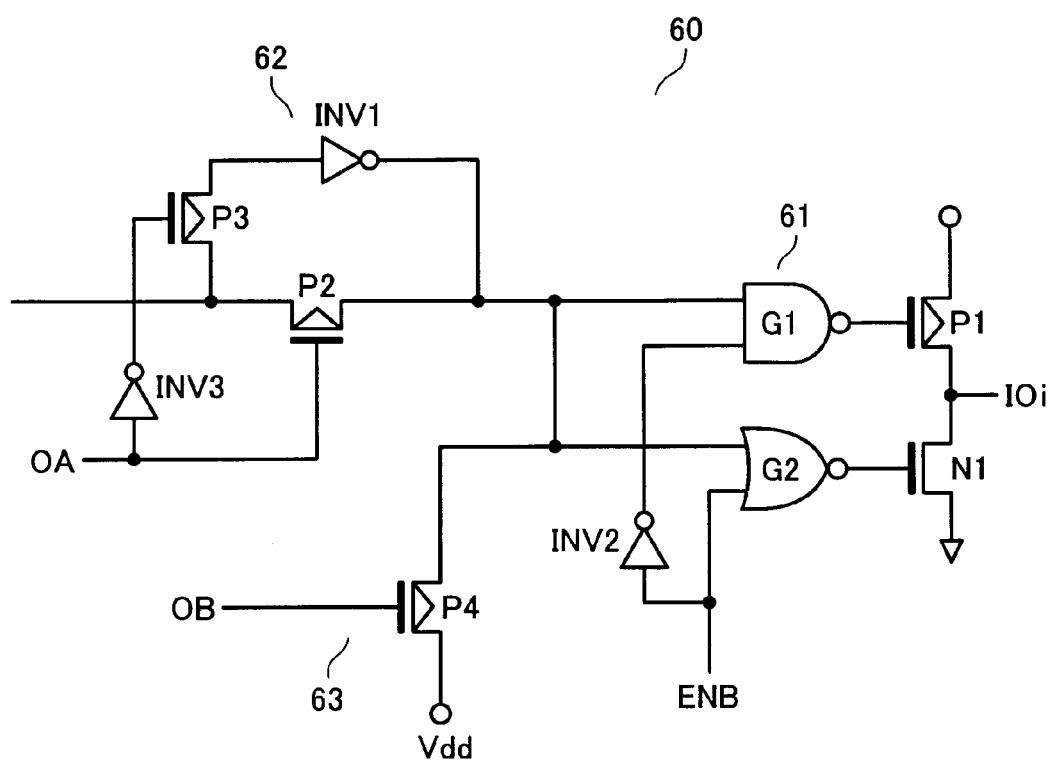
FIG. 5 shows an output circuit configuration of the flash memory.

FIG. 5 shows a configuration of an output circuit 60 in the I/O buffer 6 with respect to an I/O pin IOi. This output circuit 60 has PMOS output transistor P1 and NMOS output transistor N1, which are complementarily on-driven. An output gate 61 for driving the output transistors P1 and N1 is formed of NAND gate G1, which drives PMOS transistor P1 with transferred data, and NOR gate G2 for driving NMOS transistor N1. This output gate 61 is activated by output enable signal ENB="L" at a data output time.

Here, it is confirmed such a case that it is in need of inverting read data under a certain condition. Therefore, there is provided a data inverting circuit 62 in the output circuit 60. That is, there is prepared a data path of transferring PMOS transistor P2 and another data path, in which transferring PMOS transistor P3 and an inverter INV1 are connected in series, disposed in parallel.

Transferring PMOS transistors P2 and P3 are complementarily driven by signal OA. That is, in case of OA="L", read data is not inverted while in case of OA="H", data is inverted to be output.

Further disposed in the output circuit 60 is an output level fixing circuit 63, which has PMOS transistor P4 for fixing the output data to be in an "H" logic level with respect to a bad block. In detail, the drain of PMOS transistor P4, the gate and source of which are applied with signal OB and Vdd, respectively, is coupled to the common input node of NAND gate G1 and NOR gate G2.

Signal OB is such a control signal that is output from the internal controller 10 monitoring the output BBF of the bad block flag latch 35 in the row decoder 3. That is, in case of BBF="1" (bad), OB="L". With this control signal, the both inputs of NAND gate N1 and NOR gate N2 are fixed at "H" (=Vdd) with respect to a bad block, so that IO pad IOi will be fixed at "H".

Figure 6:
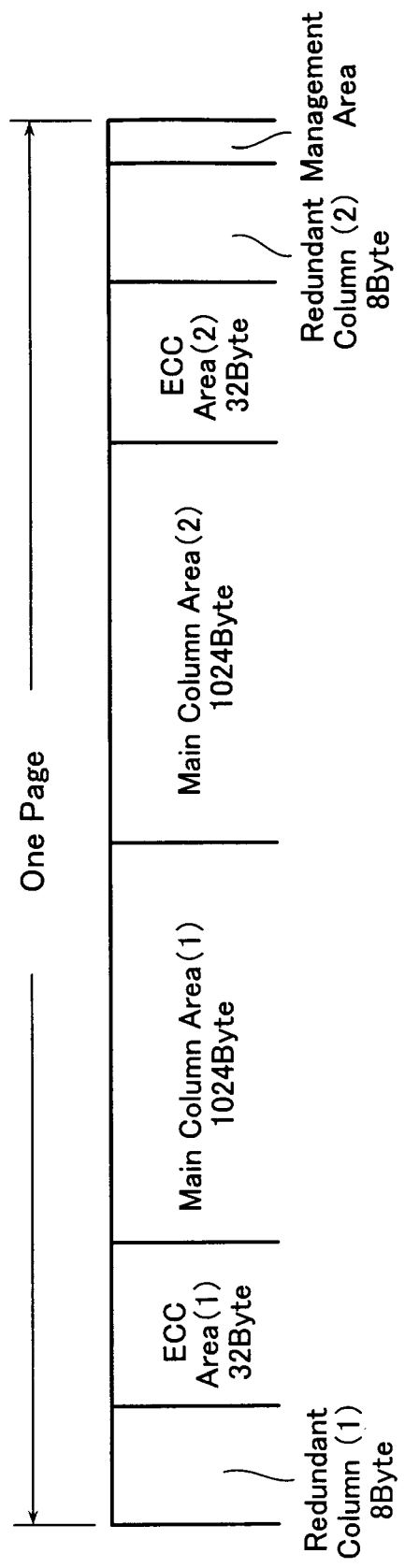
FIG. 6 shows a column configuration of one page of the flash memory.

FIG. 6 shows a column configuration example of one page in this embodiment. Here, one page is defined by a set of cells, the data of which are simultaneously read and written. Explaining in detail, a set of cells selected by a word line and all even numbered bit lines or another set of cells selected by a word line and all odd numbered bit lines serves as a page.

As shown in FIG. 6, one page includes main column areas of 2×1024[Byte]; ECC areas of 2×32[Byte] used for error—correcting the respective main column areas; and redundant column areas of 2×8[Byte] used for replacing defective columns. In addition to these columns, there is provided a management area at a certain location in the page, which is formed of at least one bit data area for designating goodness/badness of the corresponding block. The management area is defined as an area, based of which the external controller 20 judges goodness/badness of a block.

It is assumed here that the cell of the management area is always kept at an erase state with a negative threshold voltage. That is, supposing that an on-state of a selected cell with a read voltage applied is defined as data "1" while an off-state of the selected cell is defined as data "0", the cell of the management area is always read as data "1". However, with respect to a bad block, as apparent from the row decoder configuration as described above, a word line drive voltage is not transferred to a selected word line, so that the selected cells become off to be read out as data "0".

External controller 20 judges in principle the goodness/badness of a block based on the management area data. However, there is such a case that output data is inverted in the output circuit. Therefore, if all data including the management area data are inverted, there is a fear of making the external controller 20 impossible to judge the goodness/badness of a block.

In consideration of this situation, data fixing circuit 63 is provided in the output circuit 50, as explained in FIG. 5, for forcedly fixing the read data of a bad block at "H" (="0" data). The detailed operation will be explained later.

Figure 7:
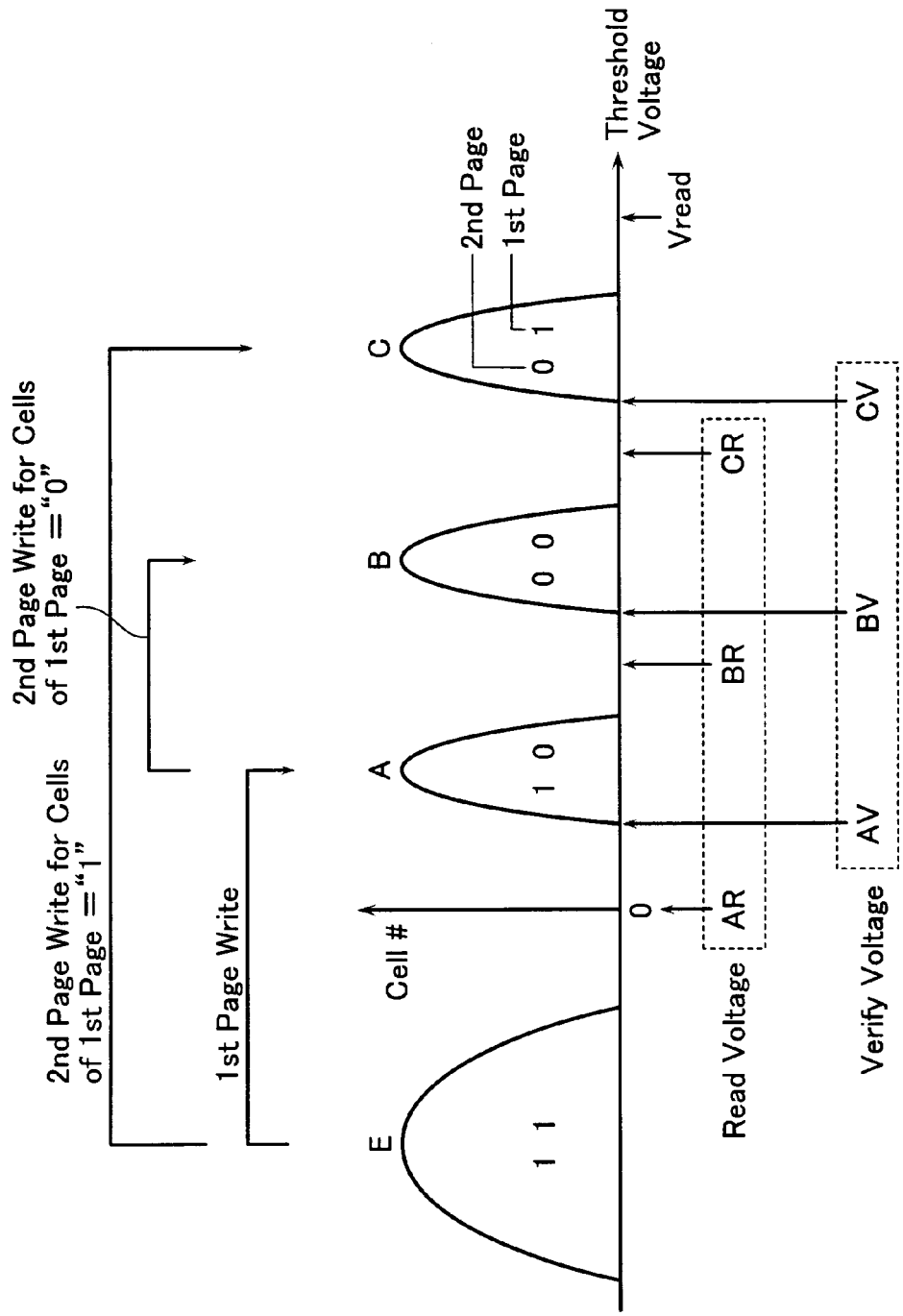
FIG. 7 shows four-level data threshold distributions and data bit assignment of the flash memory.

The flash memory in accordance with this embodiment is constructed in consideration of such a case that it is required of the read data to be inverted under a certain condition. In detail, FIG. 7 shows data threshold distributions and data bit assignment thereto in the four-level data storage scheme in the flash memory in accordance with this embodiment.

Data state "E" with a negative threshold voltage is an erase state. Data states "A", "B" and "C", which have threshold voltages increased in this order, are written from erase state "E". Suppose that, for example, four-level data is expressed by "xy" where "y" is a first page data (for example, the lower page data); and "x" a second page data (for example, the upper page data), data "11", "10", "00" and "01" are assigned to data states "E", "A", "B" and "C" arranged in the order of the threshold voltages, respectively.

Previous to data write, data erase is performed by a block in such a way that all word lines in a selected block are set at 0V; and the p-type well, on which the memory cell array is formed, is applied with an erase voltage Vera of about 20V. With this voltage application, electrons in the floating gates of all cells are discharged to channels thereof, so that the erase state "E" will be obtained in all cells.

Data write is performed by a page. In case of the data bit assignment shown in FIG. 7, first, the first page (e.g., the lower page) write is performed to selectively increase the threshold voltages of cells with data state "E" to that of data state "A". Following it the second page (e.g., the upper page) write is performed to selectively increase the threshold voltages of data states "E" and "A" to those of data states "C" and "B", respectively.

That is, as the second page write, data write for selectively writing data "C" into data "E" cells, and data write for selectively writing data "B" into data "A" cells are performed simultaneously in parallel.

The lower limit of the threshold distribution of data "A" at the first page write time is defined by a verify voltage AV, which is applied to a selected word line at a verify-read time. At the second page write time, it is in need of performing two verify-reads for verifying data states "B" and "C". The lower limits of the threshold distributions of data "B" and "C" at the second page write time will be defined by verify voltages BV and CV, which are applied to the selected word line at the respective verify-read times.

Figure 8:
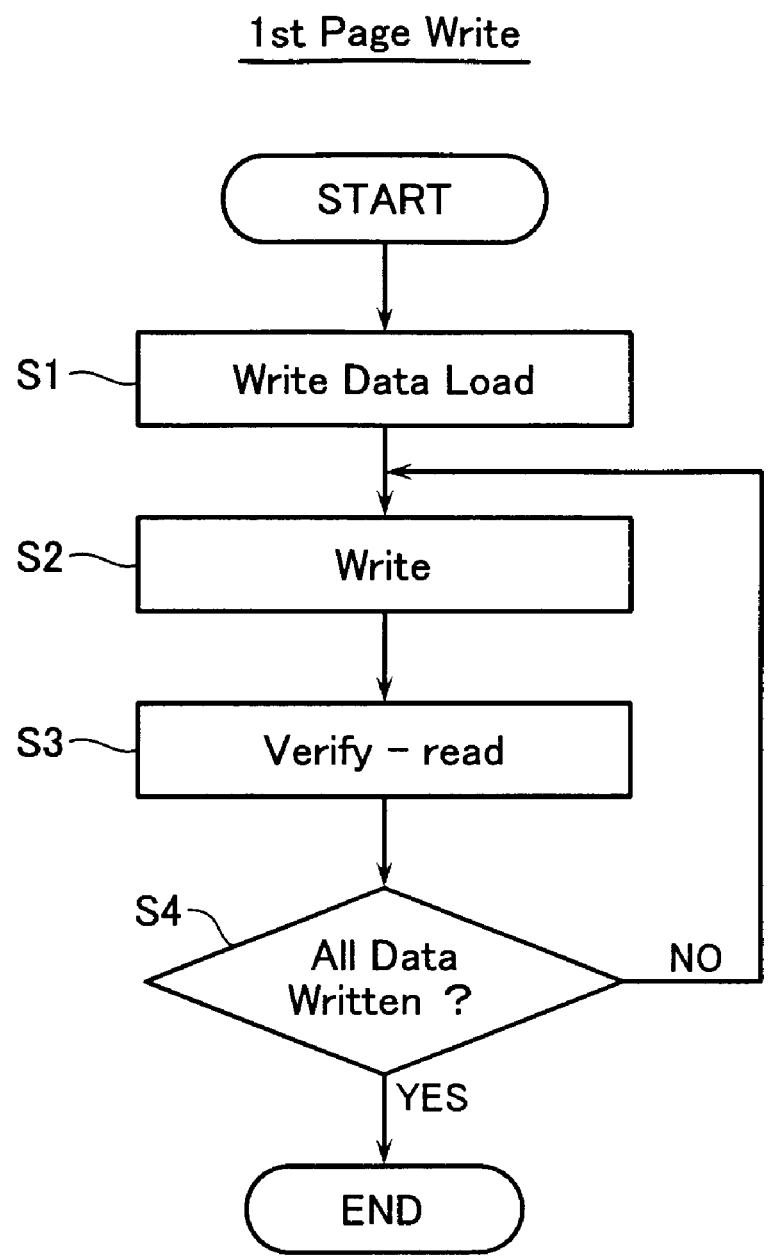
FIG. 8 shows the first page write sequence of the flash memory.

FIG. 8 shows a first page write sequence. After loading to-be-written lower page data (step S1), write (step S2) and write-verify (step S3) are repeatedly performed until it is detected that all write data have been completely written (step S4).

The write step S2 is so performed as to inject electrons into floating gates selected in accordance with write data under the condition that the selected word line is applied with boosted write voltage Vpgm; and non-selected word lines are applied with pass voltage Vpass. In detail, previous to applying the write voltage, selected cell channels are set at 0V (in case of "0" data write), or set in a floating state with Vdd (in case of "1" data write, i.e., write inhibit).

When the write voltage Vpgm is applied in the above-described situation, electrons are injected into the floating gate of "0" write cells while electron injection will not be generated in the "1" write cells because cell channels are boosted due to capacitive coupling.

At the verify-read step S3, verify-read is performed under the condition that the selected word line is set at verify voltage AV while non-selected word lines are set at read pass voltage Vread. At this verify-read, data is so controlled that the entire data storage circuits PDC storing one page write data become an all "1" state when data write has been completed. Detecting the all "1" state, it will be judged the write completion.

Figure 9:
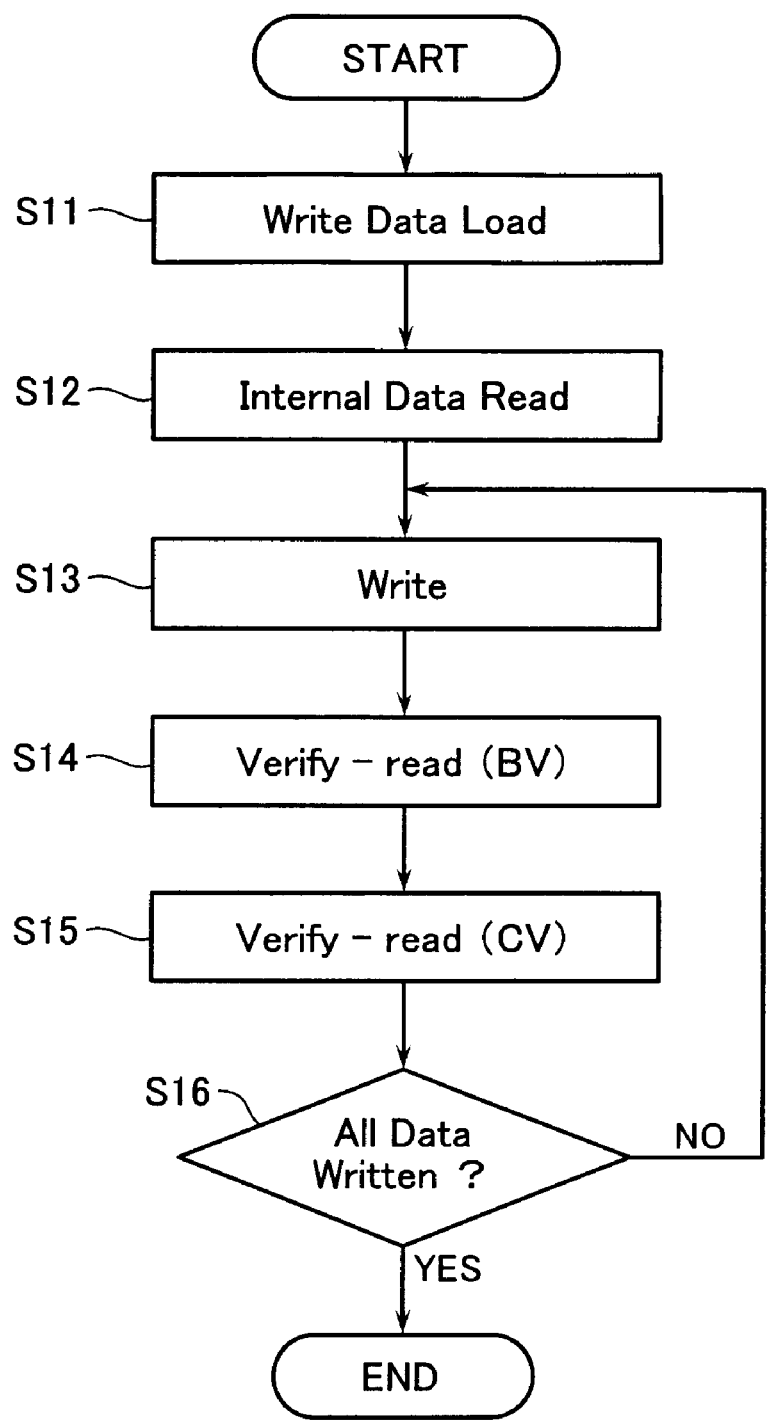
FIG. 9 shows the second page write sequence of the flash memory.

FIG. 9 shows a second page write sequence. In the second page write sequence, it is in need of referring to the first page data. Therefore, the second page write data are loaded in data storage circuits PDC in the respective sense amplifiers SA (step S11), and the first page data, which have already been written in the cell array, are read out to be stored in data storage circuits SDC (step S12).

Then, as basically similar to the first page write, write step S13 and write-verify steps S14 and S15 are repeatedly performed until write completion is judged at the write completion judging step S16.

Verify-read is performed with the following two steps: step S14 for verifying data state "B" with verify voltage BV; and step S15 for verifying data state "C" with verify voltage CV. At these verify-read steps S14 and S15, the first page data is referred to such that verify operations are performed for the first page data "0" and "1" cells, respectively.

Next, a normal data read operation will be explained. The second page data read is performed to detect whether a selected cell is turned on or kept off under the bias condition that a selected word line is applied with a read voltage BR set between the threshold distributions of data "A" and "B"; and non-selected word lines with read pass voltage Vread. In detail, a selected bit line is precharged to a certain voltage, and then discharged for a certain time under the above-described bias condition. Detecting the bit line voltage after discharging, the selected cell's data will be sensed.

It is required of the first page data read to do a first read step for distinguishing between data states "E" and "A" with the second page data "1", and a second read step for distinguishing between data states "B" and "C" with the second page data "0".

At the first read step, ON/OFF of the selected cell is detected with read voltage AR set between the threshold distributions of data states "E" and "A". At the second read step, it is detected with read voltage CR set between the threshold distributions of data states "B" and "C".

In the data bit assignment method shown in FIG. 7, the second page read and the first read step of the first page read are defined to read the selected cell's off-state as data "0" while the second read step of the first page read is defined to read the selected cell's off-state as data "1".

In other words, if "H" or "L" sensed data of the sense amplifier SA is output without inverting it in logic at a certain read step, correct data will not be output.

In consideration of this point, as explained with reference to FIG. 5, data inverting circuit 62 is prepared in the output circuit 60. That is, at the second read step of the first page read, when the sensed data in the sense amplifier is externally output, it will be inverted.

Figures 10, 11:
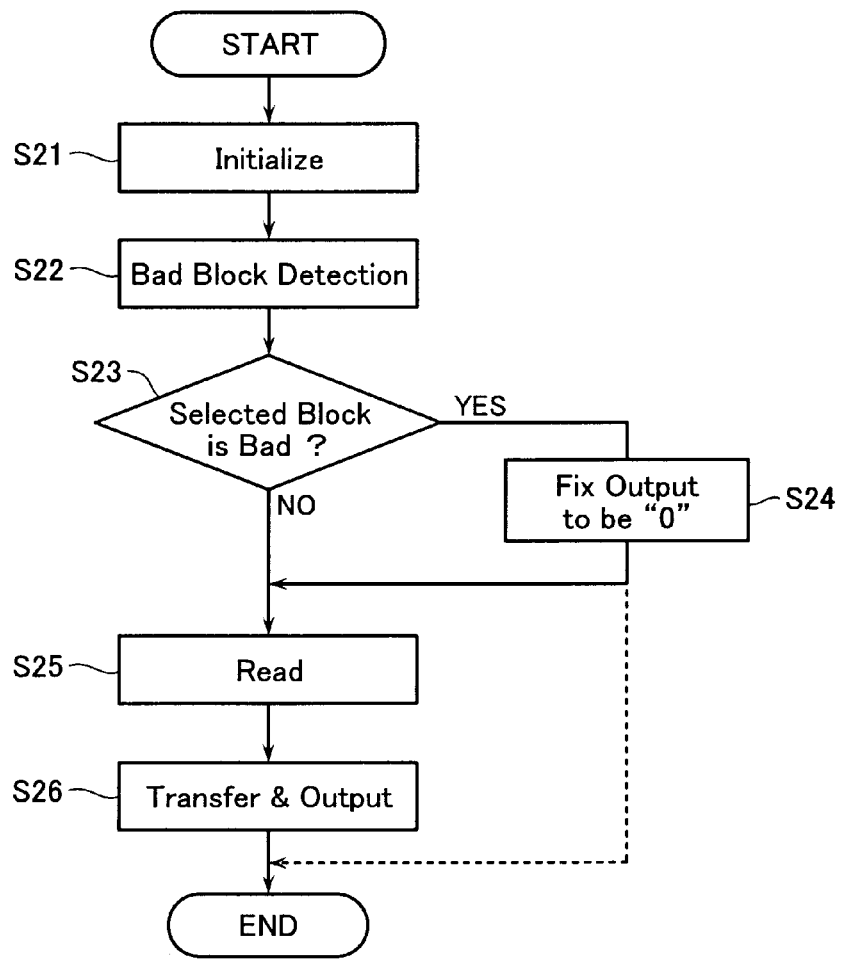
FIG. 10 shows an operation mode of a level inverting circuit in the output circuit of the flash memory.
FIG. 11 shows a read operation flow of the flash memory.

In detail, FIG. 10 shows the states of signal OA controlling the data inverting circuit 62 shown in FIG. 5 at the respective steps. As shown in FIG. 10, in case of the first page read with read voltage CR, signal OA is set at "H" to activate the data inverting circuit 62. Explaining in detail, it is for a cell judged as data level C or B that signal OA is set to be at "H" while the cell data corresponding to the management area, in which data level E has been written, is not to be inverted with OA="L". At the remaining read steps, OA is set at "L". As a result, the external controller may read correct data.

On the other hand in this embodiment, when a bad block is accessed, the internal controller 10 detects it to forcedly fix the output data to be "0". As a result, it becomes possible to make the external controller 20 not confused for judging goodness/badness of a block due to the management area data. The details will be explained below.

FIG. 11 shows a read operation flow in accordance with this embodiment. Initialize the sense amplifier circuit and the like (step S21), and then perform a bad block detecting operation (step S22). As described above, row decoder 3 has bad block flags BBF. Therefore, internal controller 10 is able to judge whether a selected block is defective (or bad) or not based on the bad block flags BBF (step S23).

If the read address is not bad one, read data from the cell array (step S25), and then transfer and output one page read data in the sense amplifier circuit by a column (step S26).

In case the read address is bad one, internal controller 10 outputs and transfers signal OB="L" to the output circuit, thereby fixing the output data in an "H" level (="0") (step S24). Thereafter, for a bad block, in which word line drive voltages are not supplied, read step S25 and data outputting step S26 are executed as similar for the normal blocks. In this case, the sense amplifier circuit becomes to have all "0" states, in spite of whether the read data in the sense amplifier circuit are inverted or not when outputting, the output fixing circuit 63 in the output circuit 60 is activated at step S24, so that all output data are fixed to be "0".

Figure 12:
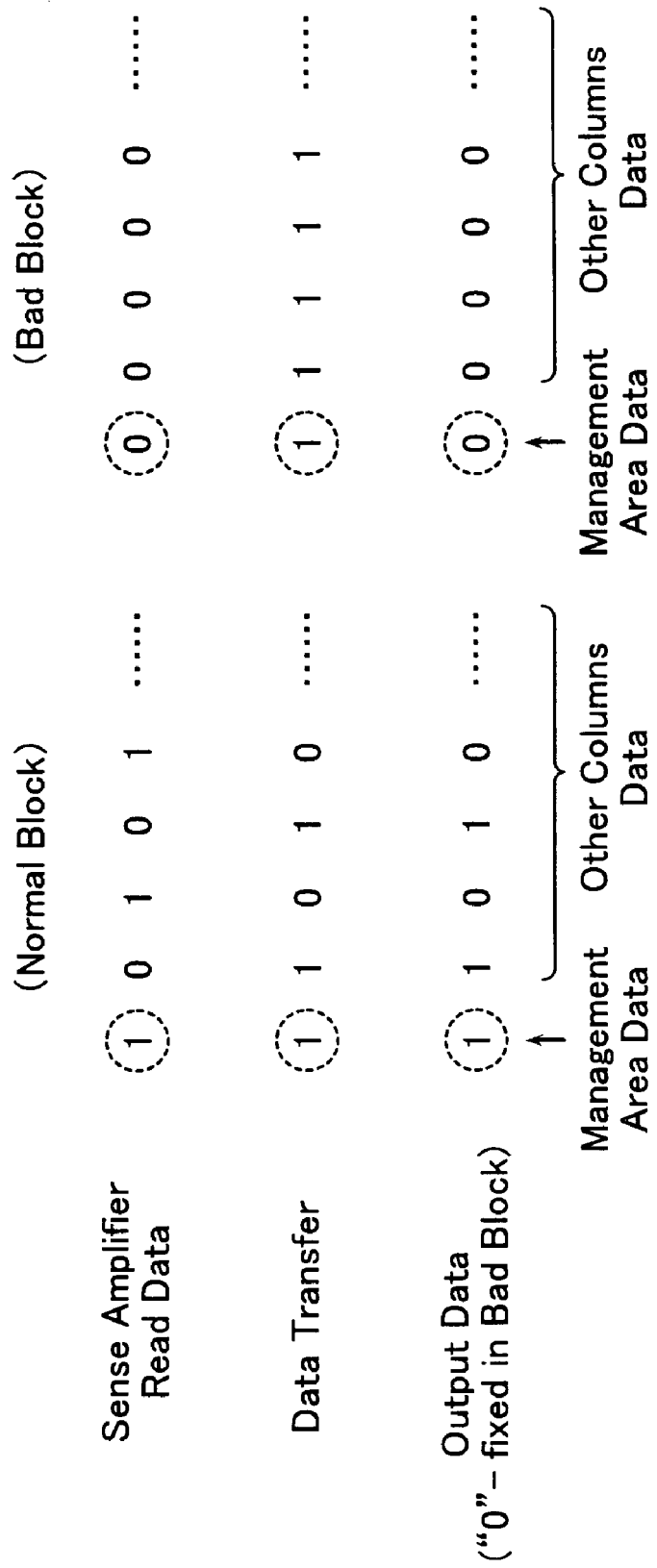
FIG. 12 shows data transition states in the first page read operation with read voltage CR.

FIG. 12 shows data transition states in the first page data read with read voltage CR with respect to a normal block and a bad block. Read data in the sense amplifier circuit are as follows: management area data is "1" in the normal block; and all column data including the management area data are "0" in the bad block.

In case of this first page read, the management area data with level E is not inverted while cell data detected as level C or B is inverted in the output circuit 60. That is, with respect to the normal block, data inverting circuit 63 shown in FIG. 5 in correspondence with the management area is kept inactive, and the others are activated. With respect to the bad block, all cells' data are judged as level C, whereby all data including management area data are inverted to "1" as shown in FIG. 12.

However, with respect to the bad block, output data are fixed to be "0" by the output fixing circuit 63. Therefore, taking notice the management area data with respect to the final output data, it becomes "1" in the normal block while it becomes "0" in the bad block. External controller 20 may judge in accordance with this management area data whether a block is good (i.e., normal) or bad (i.e., defective).

As shown by a dotted line in FIG. 11, in case a bad block is detected, data read sequence may be finished after fixing the output data to be "0" without performing normal read step and transfer/output step. In this case, the management area data is: "1" in the normal block; and "0" in the bad block. Therefore, external controller 20 may judge whether a block is good or bad.

Figure 13:
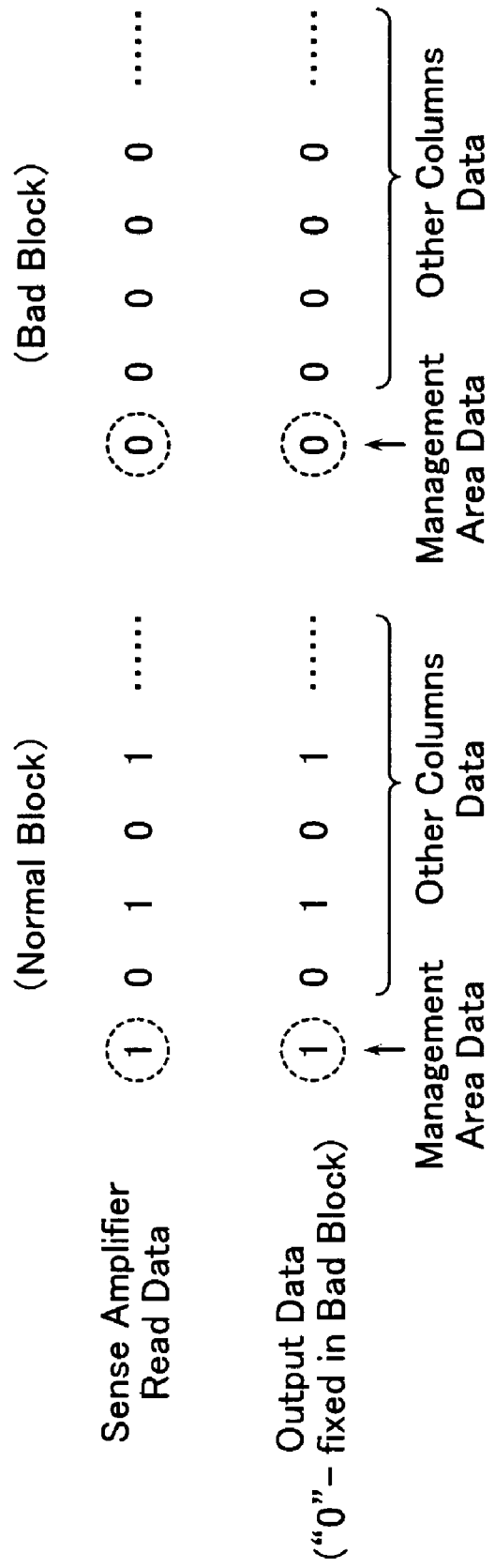
FIG. 13 shows data transition states in the first page read operation with read voltage BR and in the second page read operation with read voltage AR.

FIG. 13 shows data transition states in case of the second page data read with read voltage BR and in case of the first page read with read voltage AR. In these cases, data inverting operation is not performed in the output circuit. With respect to a bad block, read data in the sense amplifier circuit are all "0", but output data thereof are forcedly fixed to be "0" with signal OB="L".

Therefore, taking notice the management area data with respect to the final output data, it becomes "1" in the normal block while it becomes "0" in the bad block. External controller 20 may also judge in accordance with this management area data whether a block is good or bad.

In the above-described embodiment, as an example, in which it is required of the output data to be selectively inverted, it has been explained a four-level data storage scheme with the bit assignment shown in FIG. 7. The present invention is not limited to this, but may be adapted to other multi-level data storage scheme, in which it is required of the output data to be selectively inverted. Specifically, in case of eight-level or sixteen-level data storage scheme, there is a large necessity for selectively inverting data in the output data. Therefore, the present invention is effectively adaptable to a flash memory with the above-described multi-level data storage schemes.

As an embodiment, an electric card using the non-volatile semiconductor memory devices according to the above-described embodiment of the present invention and an electric device using the card will be described bellow.

Figure 14:
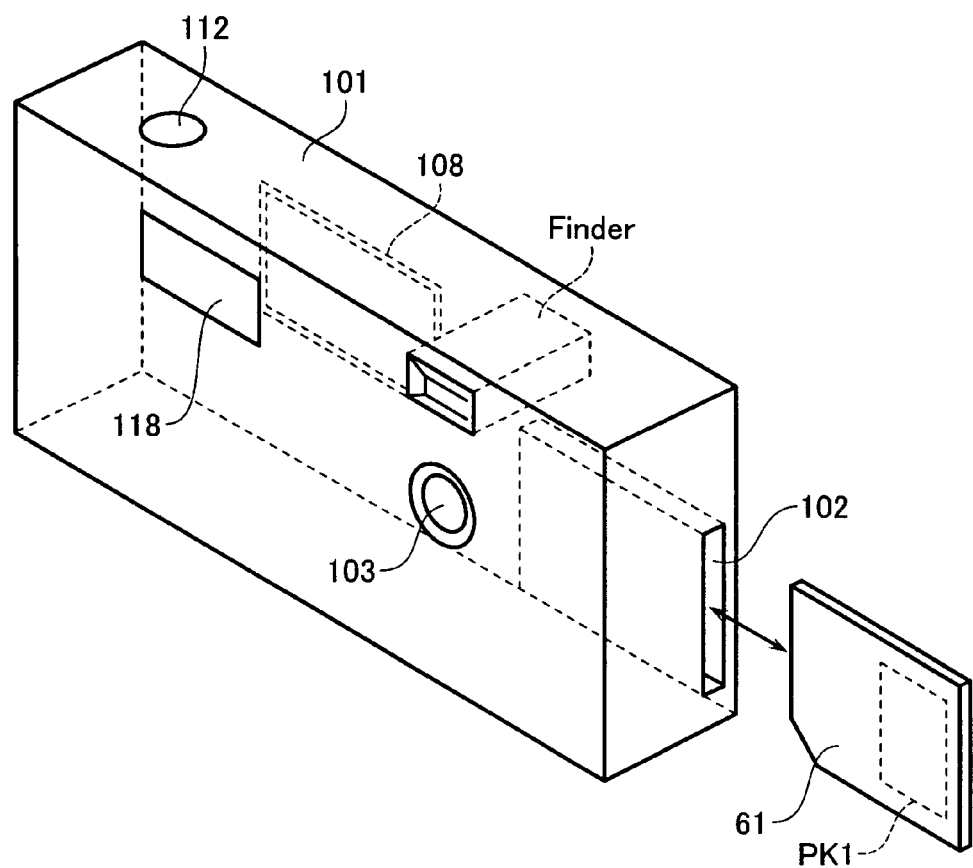
FIG. 14 shows another embodiment applied to a digital still camera.

FIG. 14 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 15:
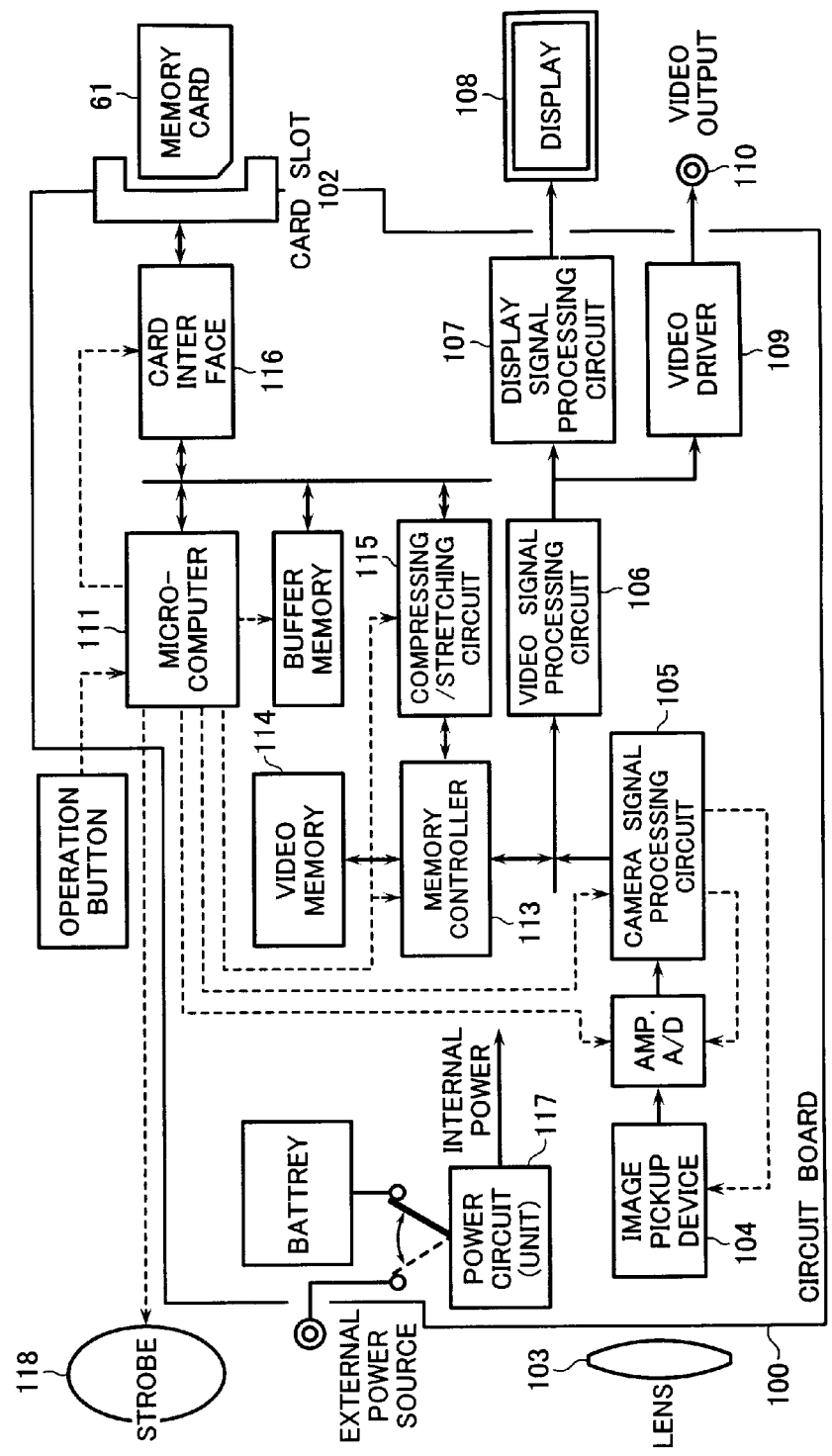
FIG. 15 shows the internal configuration of the digital still camera.

FIG. 15 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

Figure 16A:
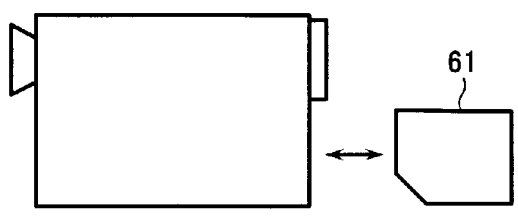
FIGS. 16A to 16J show other electric devices to which the embodiment is applied.
Figure 16F:
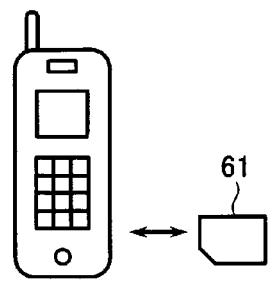
Figure 16B:
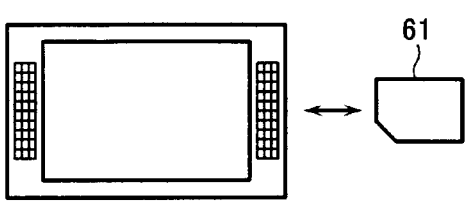
Figure 16G:
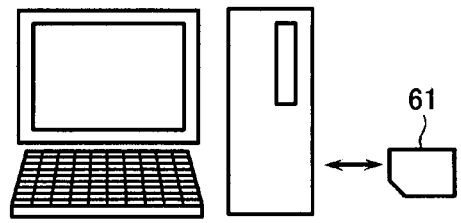
Figure 16C:
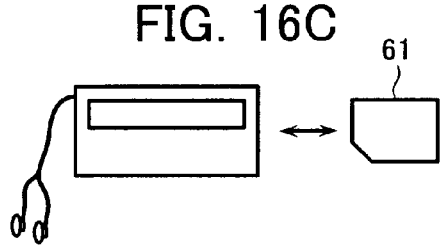
Figure 16H:
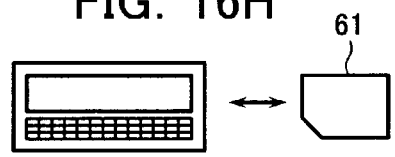
Figure 16D:
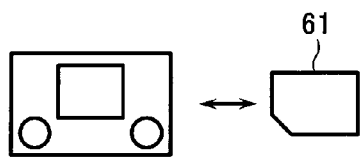
Figure 16I:
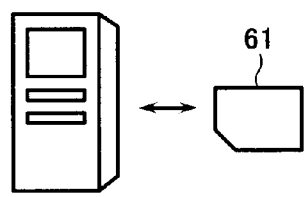
Figure 16E:
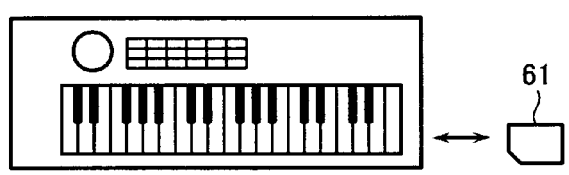
Figure 16J:
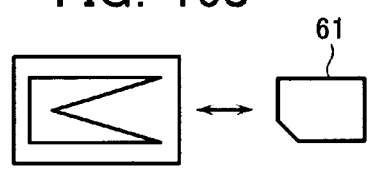

As described above, the electric card according to this embodiment can be used in portable electric devices such as the digital still camera explained above. However, the electric card can also be used in various apparatus such as shown in FIGS. 19A to 19J, as well as in portable electric devices. That is, the electric card can also be used in a video camera shown in FIG. 16A, a television set shown in FIG. 16B, an audio apparatus shown in FIG. 16C, a game apparatus shown in FIG. 16D, an electric musical instrument shown in FIG. 16E, a cell phone shown in FIG. 16F, a personal computer shown in FIG. 16G, a personal digital assistant (PDA) shown in FIG. 16H, a voice recorder shown in FIG. 16I, and a PC card shown in FIG. 16J.

This invention is not limited to the above-described embodiment. It will be understood by those skilled in the art that various changes in form and detail may be made without departing from the spirit, scope, and teaching of the invention.

What is claimed is:

1. A semiconductor memory device comprising:
   a memory cell array with electrically rewritable and non-volatile memory cells arranged therein;
   a row decoder configured to select a memory cell in the memory cell array, the row decoder including a flag latch, in which a bad block flag is set for a bad block in the memory cell array;
   a sense amplifier configured to sense data of a selected memory cell in the memory cell array; and
   an output circuit configured to output read data in the sense amplifier, the output circuit including an output data fixing circuit configured to fix an output data at a logic level in accordance with the bad block flag.

2. The semiconductor memory device according to claim 1, wherein
   the memory cell array stores such multi-level data that it is required of read data in the sense amplifier to be output together with level inverting under a certain read condition.

3. The semiconductor memory device according to claim 2, wherein
   the output circuit has a data inverting circuit for inverting and outputting the read data in the sense amplifier under the certain read condition.

4. The semiconductor memory device according to claim 2, wherein
   the memory cell array is for storing four-level data (xy) (where, x is an upper page data; and y a lower page data), in which (11), (10), (00) and (01) are assigned in the order of the cell threshold voltages.

5. The semiconductor memory device according to claim 2, wherein
   the memory cell array is formed of NAND cell units arranged therein, the NAND cell unit including multiple memory cells connected in series.

6. The semiconductor memory device according to claim 1, wherein
   the memory cell array stores such multi-level data that it is required of read data in the sense amplifier to be output together with level inverting under a certain read condition, and wherein
   one page data in the memory cell array are simultaneously read, and a certain location in the one page is set as a management area, based on which an external controller judges whether a block is good or bad.

7. The semiconductor memory device according to claim 6, further comprising an internal controller configured to detect the bad block flag held in the row decoder and make the output data fixing circuit active or inactive based on the bad block flag, whereby the management area data in a normal block is reversed in logic to that in a bad block in the output circuit.

8. A semiconductor memory device comprising:
   a memory cell array with electrically rewritable and non-volatile memory cells arranged therein, a certain location in one page of the memory cell array being set as a management area, based on which an external controller judges whether a block is good or bad;
   a row decoder configured to select a memory cell in the memory cell array, the row decoder including a flag latch, in which a bad block flag is set for a bad block in the memory cell array;
   a sense amplifier circuit configured to sense data of one page memory cells selected in the memory cell array;
   an output circuit configured to output read data in the sense amplifier, the output circuit including a data inverting circuit for inverting and outputting the read data in the sense amplifier circuit under a certain read condition and an output data fixing circuit configured to fix an output data at a logic level in accordance with the bad block flag; and
   an internal controller configured to detect the bad block flag held in the row decoder and make the output data fixing circuit active or inactive based on the bad block flag, whereby the management area data in a normal block is reversed in logic to that in a bad block in the output circuit.

9. The semiconductor memory device according to claim 8, wherein
   the memory cell array stores such multi-level data that it is required of read data in the sense amplifier circuit to be output together with level inverting under a certain read condition.

10. The semiconductor memory device according to claim 9, wherein
    the memory cell array is for storing four-level data (xy) (where, x is an upper page data; and y a lower page data), in which (11), (10), (00) and (01) are assigned in the order of the cell threshold voltages.

11. The semiconductor memory device according to claim 9, wherein
    the memory cell array is formed of NAND cell units arranged therein, the NAND cell unit including multiple memory cells connected in series.

* * * * *